(12) United States Patent
Hasegawa et al.

(10) Patent No.: US 11,031,023 B2
(45) Date of Patent: Jun. 8, 2021

(54) SIGNAL PROCESSING DEVICE, CONTROL METHOD, PROGRAM AND STORAGE MEDIUM

(71) Applicant: PIONEER CORPORATION, Tokyo (JP)

(72) Inventors: Shin Hasegawa, Saitama (JP); Yayoi Sato, Saitama (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/627,023

(22) PCT Filed: Jun. 29, 2018

(86) PCT No.: PCT/JP2018/024840
§ 371 (c)(1),
(2) Date: Dec. 27, 2019

(87) PCT Pub. No.: WO2019/009204
PCT Pub. Date: Jan. 10, 2019

(65) Prior Publication Data
US 2020/0118579 A1    Apr. 16, 2020

(30) Foreign Application Priority Data
Jul. 3, 2017    (JP) .............................. JP2017-130504

(51) Int. Cl.
*H04B 15/00*    (2006.01)
*G10L 19/032*    (2013.01)
(Continued)

(52) U.S. Cl.
CPC ........ *G10L 19/032* (2013.01); *G10L 19/0204* (2013.01); *G10L 21/034* (2013.01)

(58) Field of Classification Search
CPC .. G10L 19/032; G10L 19/0204; G10L 21/034
See application file for complete search history.

(56) References Cited

U.S. PATENT DOCUMENTS 6,034,315 A    3/2000  Takenaka et al.
2002/0156624 A1  10/2002  Gigi
(Continued)

FOREIGN PATENT DOCUMENTS

JP    07-193502    1/1995
JP    10-013244    1/1998
(Continued)

OTHER PUBLICATIONS

International Search Report, PCT/JP2018/024840, dated Oct. 2, 2018.
(Continued)

*Primary Examiner* — Simon King
(74) *Attorney, Agent, or Firm* — Nixon & Vanderhye

(57) ABSTRACT

A converter includes a time window cut-out block, a fast Fourier transform (FFT) block, an attenuation amount limitation block, a quantization noise attenuation block, an overtone generation block, an inverse fast Fourier transform (IFFT) block, and a time window resynthesis block. The attenuation amount limitation block determines the maximum attenuation amount of quantization noise to be attenuated in the quantization noise attenuation block based on the magnitude of a signal level of sound data supplied from the time window cut-out block. The quantization noise attenuation block adjusts amplitude in a frequency domain based on the maximum attenuation amount determined by the attenuation amount limitation block, to attenuate the quantization noise.

14 Claims, 11 Drawing Sheets

(51) Int. Cl.
*G10L 19/02* (2013.01)
*G10L 21/034* (2013.01)

(56) References Cited

U.S. PATENT DOCUMENTS

| | | | | |
|---|---|---|---|---|
| 2004/0170290 | A1* | 9/2004 | Chang | G10L 19/032 |
| | | | | 381/94.2 |
| 2010/0020985 | A1 | 1/2010 | Majumdar et al. | |
| 2011/0270616 | A1* | 11/2011 | Garudadri | G10L 19/02 |
| | | | | 704/500 |
| 2013/0006645 | A1* | 1/2013 | Jiang | H03M 7/3082 |
| | | | | 704/500 |
| 2014/0249807 | A1* | 9/2014 | Vaillancourt | G10L 21/0224 |
| | | | | 704/207 |
| 2015/0262585 | A1* | 9/2015 | Matsumura | G10L 19/002 |
| | | | | 704/205 |
| 2016/0019908 | A1* | 1/2016 | Hedelin | G10L 19/008 |
| | | | | 704/500 |
| 2016/0196826 | A1* | 7/2016 | Stone | G10L 19/035 |
| | | | | 704/200.1 |
| 2018/0063644 | A1* | 3/2018 | Bach | H04R 3/06 |
| 2018/0108360 | A1* | 4/2018 | You | G10L 19/032 |
| 2018/0358028 | A1* | 12/2018 | Biswas | H03G 7/007 |

FOREIGN PATENT DOCUMENTS

| | | |
|---|---|---|
| JP | H11-73726 A | 3/1999 |
| JP | 2003-504669 | 2/2003 |
| NO | 02/082427 A1 | 10/2002 |
| WO | WO 01/02929 | 1/2001 |

OTHER PUBLICATIONS

Extended European Search Report issued in European Patent Application No. 18827498.9 dated Mar. 1, 2021.

Lefebvre et al., "Spectral Amplitude Warping (Saw) for Noise Spectrum Shaping in Audio Coding," IEEE, 1997, pp. 335-338.

* cited by examiner

SIGNAL PROCESSING DEVICE, CONTROL METHOD, PROGRAM AND STORAGE MEDIUM

TECHNICAL FIELD

The present invention relates to a technique for controlling quantization noise.

BACKGROUND TECHNIQUE

Conventionally, there is known a technique for removing quantization noise of data digitized by use of a low number of quantization bits. For example, Patent Reference 1 discloses a technique in which digital data quantized by use of a low number of bits is subjected to spectrum conversion to omit a spectrum at or below a predetermined level, and then the data to which inverse Fourier transform is applied is outputted.

PRIOR ART REFERENCES

Patent References

Patent Reference 1
  Japanese Patent Laid-Open No. 7-193502

SUMMARY OF THE INVENTION

Problem to be Solved by the Invention

In Patent Reference 1, there has been a problem where, due to uniform removal of quantization noise that is not annoying in the sense of hearing, an originally existing sound component is also removed together with the quantization noise.

Examples of problems to be solved by the present invention include the example as described above. A main object of the present invention is to provide a signal processing device capable of suitably attenuating quantization noise.

Means for Solving the Problem

An invention recited in a claim is a signal processing device including: an acquisition unit configured to acquire sound data subjected to quantization; and a quantization noise control unit configured to determine a control amount for quantization noise of the sound data, generated due to the quantization, based on the level of the sound data.

An invention recited in a claim is a control method to be performed by a signal processing device, the method including: an acquisition step of acquiring sound data subjected to quantization; and a quantization noise control step of determining a control amount for quantization noise of the sound data, generated due to the quantization, based on the level of the sound data.

An invention recited in a claim is a program to be executed by a computer, the program causing the computer to function as an acquisition unit configured to acquire sound data subjected to quantization, and a quantization noise control unit configured to determine a control amount for quantization noise of the sound data, generated due to the quantization, based on the level of the sound data.

DESCRIPTION OF EMBODIMENTS

Figure 1:
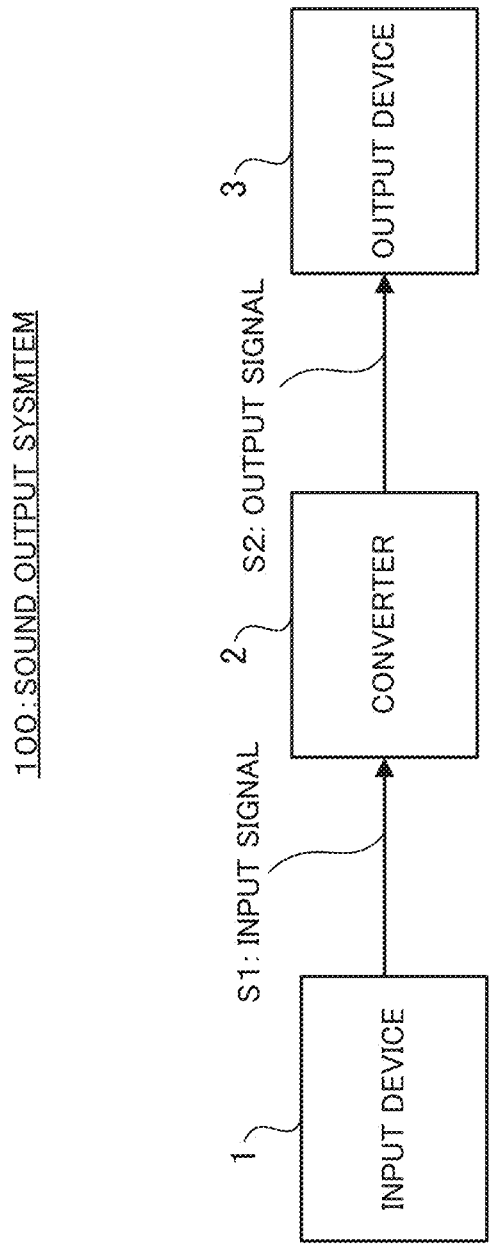
FIG. 1 shows a configuration of a sound output system according to an embodiment.

In a preferred embodiment of the present invention, a signal processing device includes: an acquisition unit configured to acquire sound data subjected to quantization; and a quantization noise control unit configured to determine a control amount for quantization noise of the sound data, generated due to the quantization, based on the level of the sound data. In this embodiment, focusing on the fact that the sense of hearing for quantization noise varies in accordance with the level of the acquired sound data, the signal processing device determines the control amount for controlling the quantization noise based on the level of the sound data. Thereby, the signal processing device can suitably control quantization noise heard by a user to reduce its influence.

In one aspect of the signal processing device, the control amount is an attenuation amount by which a signal level of the sound data is attenuated in a predetermined frequency band, and the quantization noise control unit changes the attenuation amount based on the sound level. With this aspect, the quantization noise control unit can suitably prevent unnecessary removal of an originally existing sound component while attenuating the quantization noise.

In another aspect of the signal processing device, the smaller the sound level is, the larger the quantization noise control unit makes the attenuation amount. As described later in an embodiment, the applicant has obtained knowledge that the smaller the sound level of the sound data is, the easier the quantization noise is to hear and that the smaller the sound level of the sound data is, the smaller the influence, caused by quantization noise attenuation processing, on a sound component that is not noise becomes. Thus, with this aspect, the signal processing device can suitably attenuate the quantization noise while avoiding the influence on the originally existing sound component.

In another aspect of the signal processing device, the quantization noise control unit determines the attenuation amount based on the sound level and a frequency of the sound data. As described later in the embodiment, the applicant has obtained knowledge that the quantization noise tends to be easy to hear when the frequency of the input signal is relatively low. Thus, with this aspect, the signal processing device can more effectively attenuate the quantization noise while avoiding the influence on the originally existing sound component. Preferably, the lower the frequency is, the larger the quantization noise control unit may make the attenuation amount.

Another aspect of the signal processing device further includes a conversion unit configured to convert a time waveform of the sound data to a frequency domain, and the quantization noise control unit attenuates amplitude which is less than a predetermined level, based on the control amount. With this aspect, the signal processing device can attenuate the amplitude affected by the quantization noise and suitably reduce the quantization noise.

In another aspect of the signal processing device, the conversion unit converts the time waveform of the sound data, cut out with a predetermined time interval, to a frequency domain. When the sound data is cut out in this way, characteristic in the frequency domain spreads due to the influence of the cut-out, and depending on the level of the sound data, the quantization noise is mixed with the original sound component in a specific frequency band. Even in this case, by determining the control amount based on the sound level, the signal processing device can suitably reduce the influence on the originally existing sound component while suitably attenuating the quantization noise in the range to be heard by the user.

Another aspect of the signal processing device further includes a division unit configured to divide the sound data into a plurality of frequency bands, and the quantization noise control unit determines the control amount for the quantization noise with respect to each of the plurality of frequency bands. Thereby, the signal processing device can appropriately determine the control amount with respect to each frequency band. In a preferred example, the signal processing device further includes an overtone generation unit configured to perform overtone generation on the sound data with the quantization noise controlled, and an output unit configured to output the sound data subjected to the overtone generation. With this aspect, the signal processing device can suitably perform up-conversion to a greater standard with higher quality.

In another embodiment of the present invention, a control method to be performed by a signal processing device includes: an acquisition step of acquiring sound data subjected to quantization; and a quantization noise control step of determining a control amount for quantization noise of the sound data, generated due to the quantization, based on the level of the sound data. By performing this control method, the signal processing device can suitably control quantization noise heard by the user to reduce its influence.

In another embodiment of the present invention, a program to be executed by a computer causes the computer to function as acquisition unit configured to acquire sound data subjected to quantization, and quantization noise control unit configured to determine a control amount for quantization noise of the sound data, generated due to the quantization, based on the level of the sound data. By executing this program, the computer can suitably control quantization noise heard by the user to reduce its influence. Preferably, the program is stored in a storage medium.

Embodiment

A preferred embodiment of the present invention will be described below with reference to the drawings. Hereinafter, "high-resolution" means a sound source with a sampling frequency of 96 kHz and a bit length of 24 bit, or higher precision.

[Configuration of Sound Output System]

FIG. 1 shows a configuration of a sound output system 100 according to the present embodiment. The sound output system 100 is a system for reproducing sound data by upconverting sound data of the CD standard to that of the high-resolution standard, and as shown in FIG. 1, the sound output system 100 includes an input device 1, a converter 2, and an output device 3.

The input device 1 inputs an input signal S1, which is digital data of a CD sound source, into the converter 2. The input device 1 may, for example, be an interface device that reads sound data from a recording medium such as a CD, be a communication device that receives sound data transmitted from another device by wire or wirelessly, or be a storage device that stores the input signal S1.

The converter 2 upconverts the input signal S1 input from the input device 1 to output an output signal S2, which is digital data of the high-resolution standard, to the output device 3. In this case, as described later, the converter 2 first upconverts each of a sampling frequency and a bit length to a predetermined high-resolution format. At this time, although the format has been upconverted, the signal is one with the quality of the CD specification due to being a signal containing quantization noise and not yet subjected to high-frequency interpolation. Next, processing for attenuating the quantization noise contained in the input signal S1 (quantization noise attenuation processing) and overtone generation processing are performed to generate the output signal S2 that is sound data with quality exceeding the CD specification. The converter 2 is an example of a "signal processing device" in the present invention.

The output device 3 is, for example, a speaker or the like and outputs sound based on the output signal S2 output from the converter 2. It is noted that at least one of the input device 1 and the output device 3 may be configured integrally with the converter 2. The input device 1 and the output device 3 may be configured integrally.

[Block Configuration of Converter]

Figure 2:
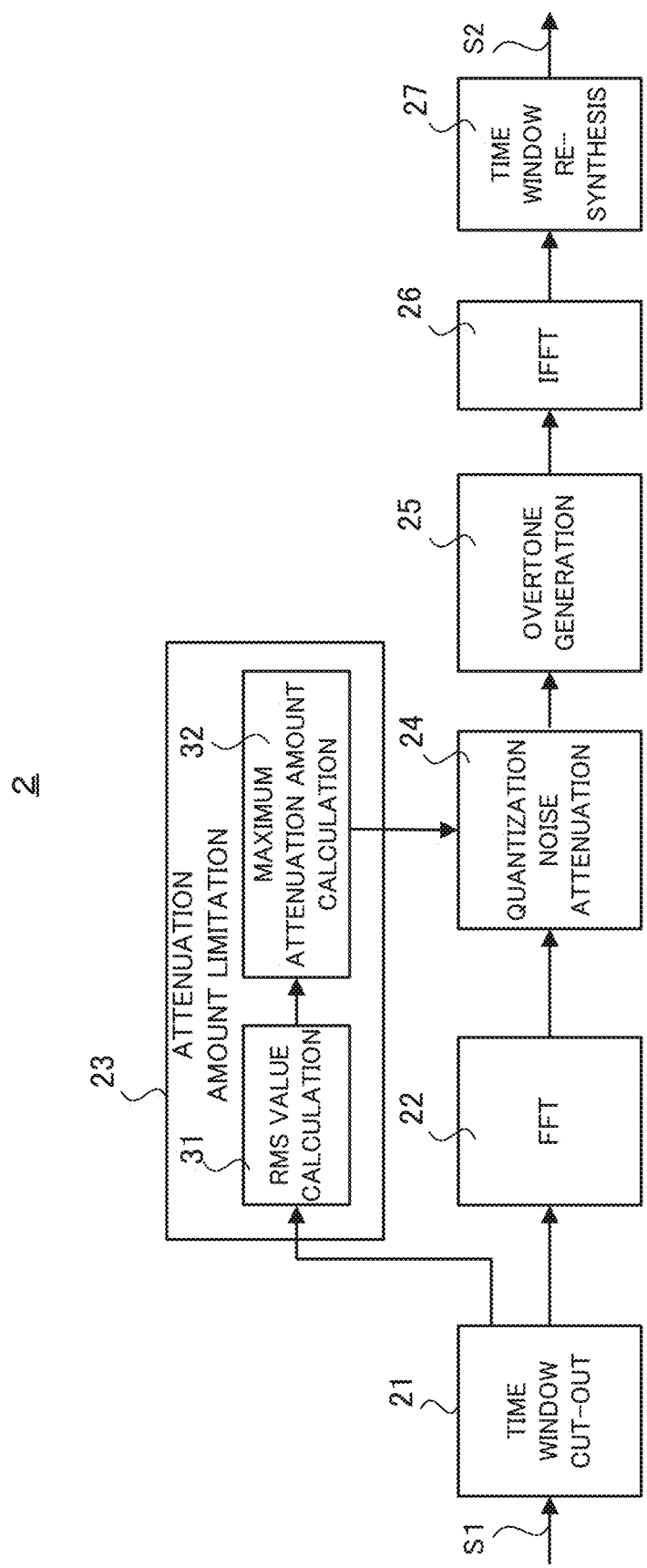
FIG. 2 shows a functional block configuration diagram of a converter.

FIG. 2 shows a functional block configuration diagram of the converter 2. The converter 2 includes a hardware configuration such as a central processing unit (CPU), a read-only memory (ROM), a random-access memory (RAM), and functionally includes a time window cut-out block 21, a fast Fourier transform (FFT) block 22, an attenuation amount limitation block 23, a quantization noise attenuation block 24, an overtone generation block 25, an inverse fast Fourier transform (IFFT) block 26, and a time window resynthesis block 27.

Based on any one of various window functions such as a banning window, the time window cut-out block 21 cuts out the time waveform of the sound data from the input signal S1 for each window width with a predetermined time length (for each frame) while applying the window function with overlap. Then, the time window cut-out block 21 supplies sound data for each frame to each of the FFT block 22 and the attenuation amount limitation block 23.

The FFT block 22 performs fast Fourier transform on the sound data with the predetermined time length, outputted by the time window cut-out block 21, and outputs amplitude and a phase for each frequency. In this case, information on the amplitude is supplied to the quantization noise attenuation block 24, and information on the phase is supplied to the overtone generation block 25.

The attenuation amount limitation block 23 determines the maximum attenuation amount with respect to the amplitude in a frequency domain to be attenuated in the quantization noise attenuation block 24, based on the magnitude of the signal level of sound data supplied from the time window cut-out block 21. The attenuation amount limitation block 23 has an RMS value calculation block 31 and a maximum attenuation amount calculation block 32. The RMS value calculation block 31 calculates a root mean square (RMS) value for each frame of the sound data supplied from the time window cut-out block 21. In this case, the RMS value calculated by the RMS value calculation block 31 corresponds to the magnitude of an average signal level of the sound data for each frame. Based on the RMS value calculated by the RMS value calculation block 31, the maximum attenuation amount calculation block 32 calculates the maximum attenuation amount corresponding to the upper limit of the attenuation amount, which is used in the quantization noise attenuation block 24, for the amplitude in the frequency domain. A detail of the calculation method for the maximum attenuation amount will be described later with reference to FIG. 3A.

It is noted that the RMS value calculation block 31 may calculate a calculated value other than the RMS value so long as being the value indicating the signal level of the sound data.

The quantization noise attenuation block 24 adjusts the amplitude in the frequency domain of a target frame based on the maximum attenuation amount determined by the attenuation amount limitation block 23, to thereby attenuate the quantization noise. In the present embodiment, the quantization noise attenuation block 24 estimates level less than −90.3 dB, which is the minimum level reproducible in the CD standard, as one generated due to quantization noise, and therefore attenuates the signal level at the frequency whose level is less than −90.3 dB. At this time, the quantization noise attenuation block 24 adjusts the signal level at the frequency whose level is less than −90.3 dB so as not to exceed the maximum attenuation amount determined by the attenuation amount limitation block 23. A specific example of the adjustment processing will be described later with reference to FIG. 3B. It is noted that −90.3 dB is an example of a "predetermined level" in the present invention. Further, the frequency whose level is less than −90.3 dB is an example of a "predetermined frequency band" in the present invention.

On the basis of the information indicative of the amplitude for each frequency outputted by the quantization noise attenuation block 24, and the information indicative of the phase outputted by the FFT block 22, the overtone generation block 25 performs the overtone generation processing to generate an overtone for high-frequency interpolation. Thereby, the overtone generation block 25 performs pseudo up-sampling on the CD sound source. Any known overtone generation technique may be applied to the overtone generation processing.

The IFFT block 26 performs inverse fast Fourier transform on the sound data in the frequency domain subjected to the overtone generation processing, to convert the sound data for each frame from the frequency domain to a time domain. The time window resynthesis block 27 overlaps and adds the sound data of each frame outputted by the IFFT block 26 to generate the smoothly connected output signal S2. Then, the time window resynthesis block 27 supplies the generated output signal S2 to the output device 3.

In the configuration shown in FIG. 2, the time window cut-out block 21 is an example of an "acquisition unit" in the present invention, and the FFT block 22 is an example of a "conversion unit" in the present invention. Further, the attenuation amount limitation block 23 and the quantization noise attenuation block 24 are an example of a "quantization noise control unit" in the present invention, the overtone generation block 25 is an example of an "overtone generation unit" in the present invention, and the time window resynthesis block 27 is an example of an "output unit" in the present invention. Further, the CPU and the like of the converter 2 which constitute each block are an example of a "computer" for executing a program in the present invention.

Here, a specific description will be given of a method for setting of the maximum attenuation amount by the maximum attenuation amount calculation block 32.

Figure 3A:
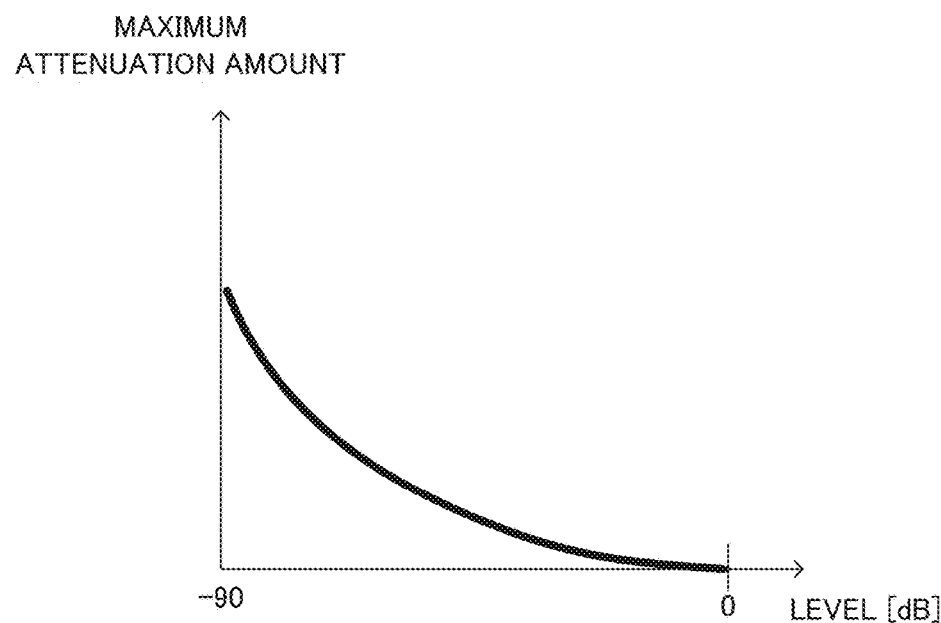
FIGS. 3A and 3B show graphs defining the maximum attenuation amount, and show a specific example of attenuation processing in a frequency domain.

FIG. 3A is a graph schematically showing the relationship between the dB value converted from the RMS value calculated by the RMS value calculation block 31 and the maximum attenuation amount determined by the maximum attenuation amount calculation block 32. In the example of FIG. 3A, the maximum attenuation amount is defined in the level range from 0 dB to about −90 dB. It is noted that about −90 dB corresponds to the minimum value of the level reproducible in the CD standard.

As shown in FIG. 3A, the maximum attenuation amount calculation block 32 increases the maximum attenuation amount as the level approaches −90 dB, that is, as the level gets smaller. In this case, for example, with reference to a formula, a table, or the like corresponding to FIG. 3A stored in advance, the maximum attenuation amount calculation block 32 determines the maximum attenuation amount from the RMS value calculated by the RMS value calculation block 31 or the dB value converted from the RMS value. Thereby, the smaller the input level of the input signal S1 is, the larger the attenuation amount can be made, and the quantization noise can be attenuated effectively while suitably reducing the attenuation of the originally required input signal. This effect will be described in more detail in the [Effect] section.

It is noted that the relation between the maximum attenuation amount and the level is not limited to the relation represented by the graph shown in FIG. 3A and that it may only be necessary to satisfy a relation in which the maximum attenuation amount increases with decreasing level. For example, the relation may be a relation indicated by a linear graph.

Next, a specific example of the quantization noise attenuation processing by the quantization noise attenuation block 24 will be described.

Figure 3B:
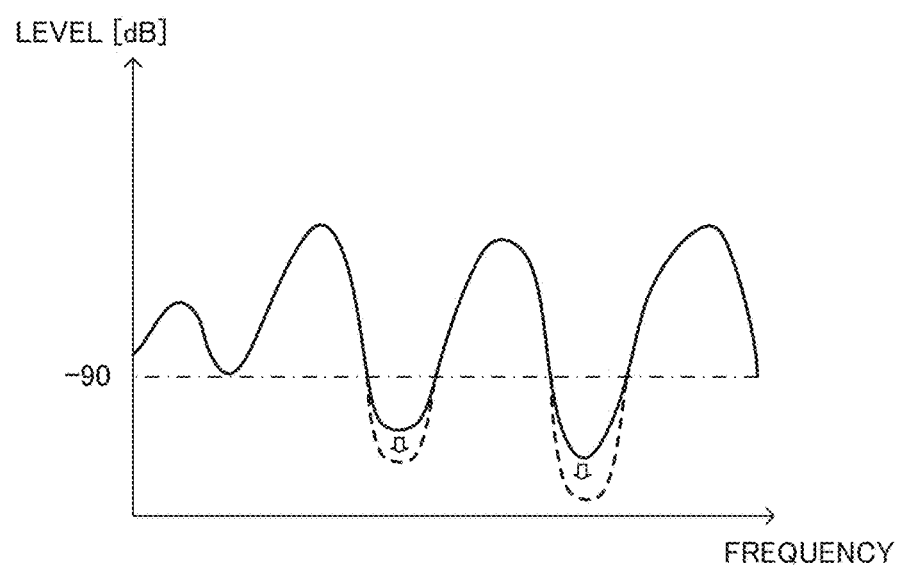

FIG. 3B shows a frequency characteristic of the sound data cut out by the time window cut-out block 21. In FIG. 3B, a solid line indicates a characteristic before the quantization noise attenuation processing, and a dashed line indicates a characteristic after the quantization noise attenuation processing by quantization noise attenuation block 24.

As shown in FIG. 3B, the quantization noise attenuation block 24 attenuates the signal level at the frequency whose level is less than −90.3 dB, which is the minimum level reproducible in the CD standard, so as not to exceed the maximum attenuation amount determined by the attenuation amount limitation block 23. Here, as an example, in a target frequency band, the quantization noise attenuation block 24 calculates the difference between −90.3 dB and the signal level of the characteristic as the attenuation amount. Then, when the calculated attenuation amount exceeds the maximum attenuation amount, the quantization noise attenuation block 24 takes the maximum attenuation amount as the attenuation amount to be applied. Thereby, the quantization noise attenuation block 24 can suitably attenuate the quantization noise while preventing the characteristic from being discontinuous.

Effect

Next, the effect of the present embodiment will be supplemented with reference to FIGS. 4A to 9B.

Figure 4A:
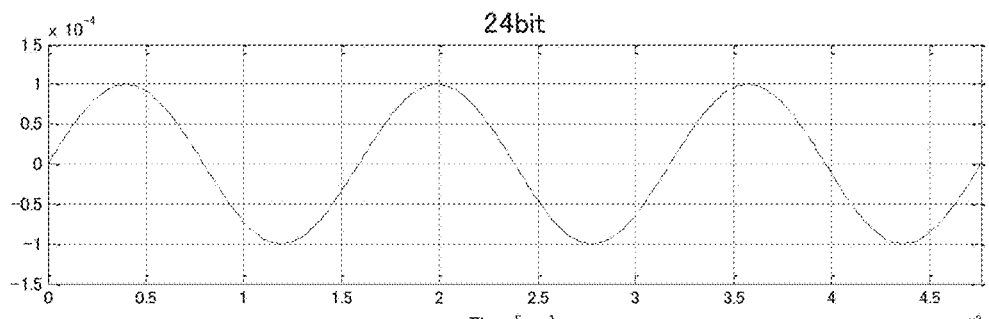
FIGS. 4A to 4D show signal waveforms in a time domain and frequency characteristics when a sine wave signal is quantized in accordance with each of the high-resolution standard and compact disc (CD) standard.
Figure 4B:
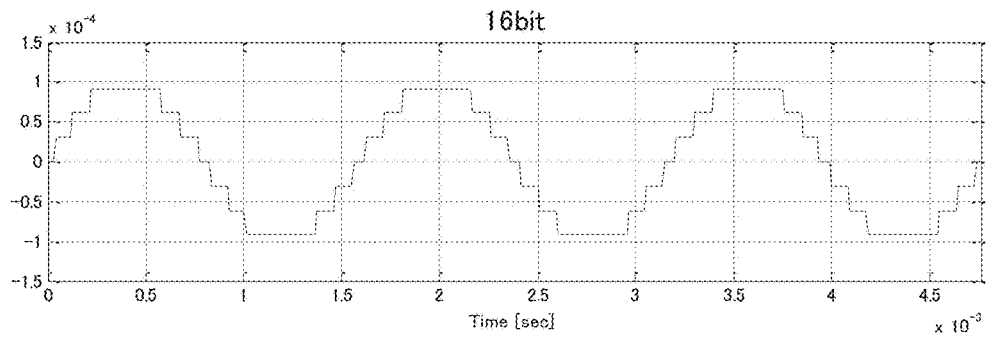
Figure 4C:
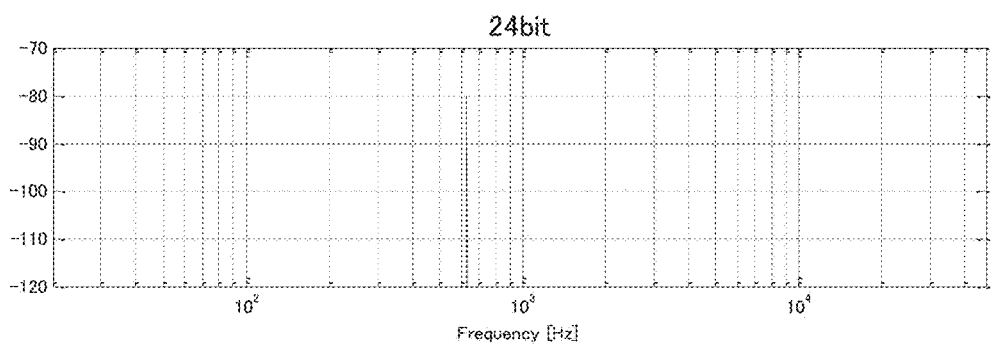
Figure 4D:
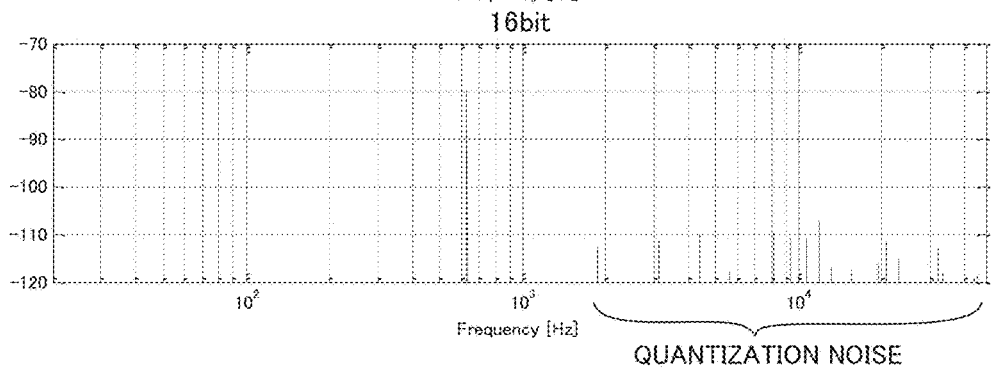

FIG. 4A shows a signal waveform obtained by quantizing sound data of a sine wave in accordance with the high-resolution standard (24-bit quantization), and FIG. 4B shows a signal waveform obtained by quantizing sound data of a sine wave in accordance with the CD standard (16-bit quantization). Further, FIG. 4C shows the frequency characteristic of the sound data in FIG. 4A, and FIG. 4D shows the frequency characteristic of the sound data in FIG. 4B.

As shown in FIG. 4B, in the case of the CD standard, small level sound or the like has become a stepped signal. Thus, as shown in FIG. 4D, in the case of the CD standard, even in an audible frequency band of 20 kHz or less, quantization noise, which hardly appears in the quantization in the high-resolution standard (24 bits here), is generated in large amount. On the other hand, in the case of the high-resolution standard, a smooth signal waveform has been formed due to the number of quantization bits being high (cf. FIG. 4A), and the quantization noise has hardly been generated (cf. FIG. 4C).

Figure 5:
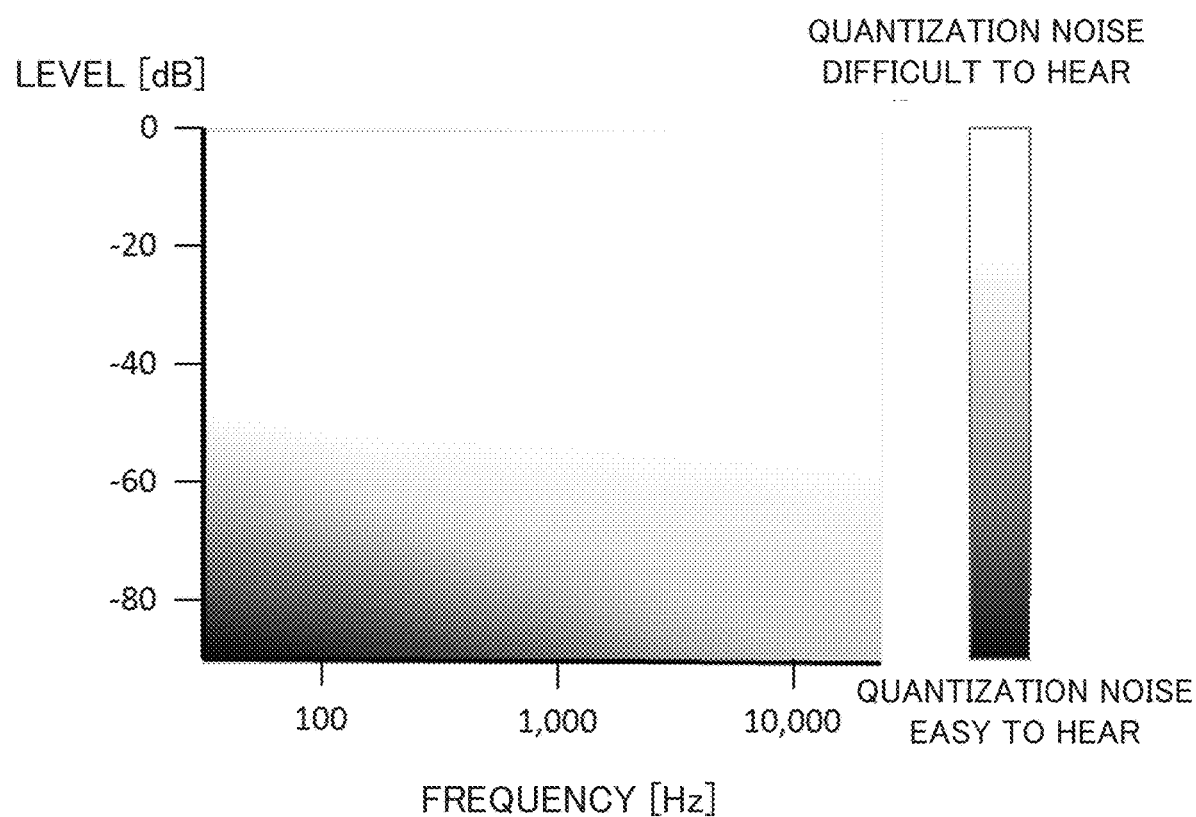
FIG. 5 shows a graph quantitatively representing the sense of hearing for quantization noise generated in the CD standard.

FIG. 5 is a graph quantitatively representing the sense of hearing for quantization noise generated in the CD standard when the combination of the frequency and the level of the original sound data, which is a sine wave, is changed. In FIG. 5, quantization noise, generated with respect to each of any combinations of the frequency and level of the original sound data that is a sine wave, is calculated and multiplied by the hearing-sense characteristic derived from a loudness curve or the like, to quantitatively obtain and visualize the sense of hearing for the quantization noise. FIG. 5 shows that the darker the color of the region, the easier the quantization noise is to hear (i.e., the easier the difference between the high-resolution standard and the CD standard is to perceive) in the region. It is noted that the applicant has conducted a listening experiment to obtain the same result as the tendency of the graph of FIG. 5.

According to the graph of FIG. 5, it is understood that there is a tendency that the lower the level and frequency of the input signal are, the easier the quantization noise is to hear, and particularly in a level region of about −70 dB or less as well as in a low-frequency band of about 1 kHz or less, the quantization noise is easy to hear. It is thus estimated that in the case of the CD standard, in the low-level region and the low-frequency band, the sound quality has been degraded due to the quantization noise. It is conceivable therefrom that the lower the input level of the input signal S1 is, or the lower the frequency of the input signal S1 is, the higher the need to attenuate the quantization noise becomes. Furthermore, it is conceivable that the lower the input level of the input signal S1 and the frequency of the input signal S1, the higher the need to attenuate the quantization noise.

Here, a description will be given of the influence at the time when in the quantization noise attenuation processing, the maximum attenuation amount is not provided and the amplitude is uniformly attenuated regardless of the magnitude of the input level of the input signal S1.

Figure 6A:
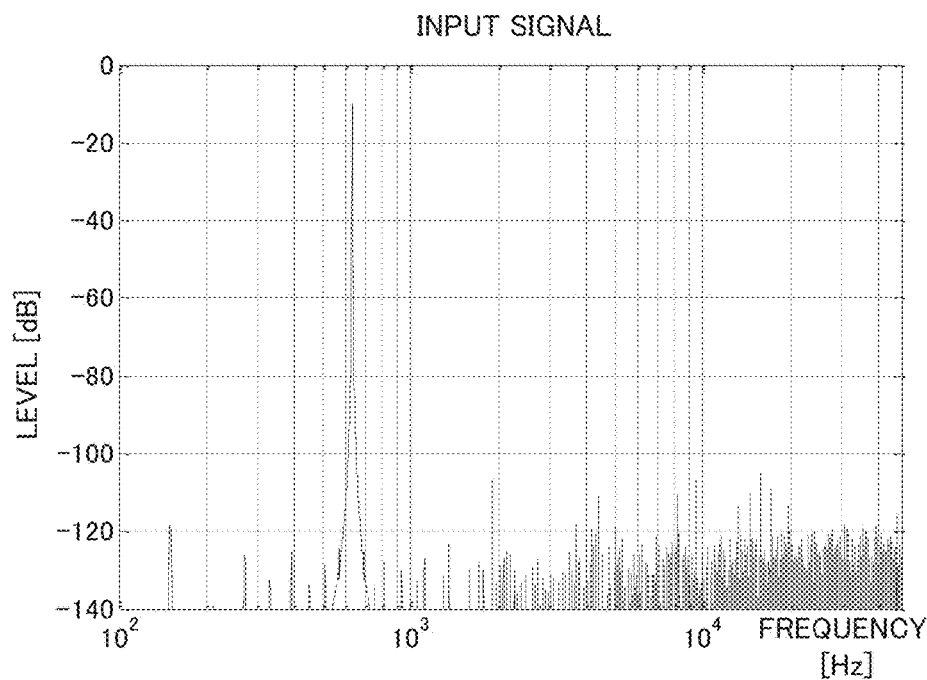
FIG. 6A is a frequency characteristic of an input signal with a relatively large input level.
Figure 6B:
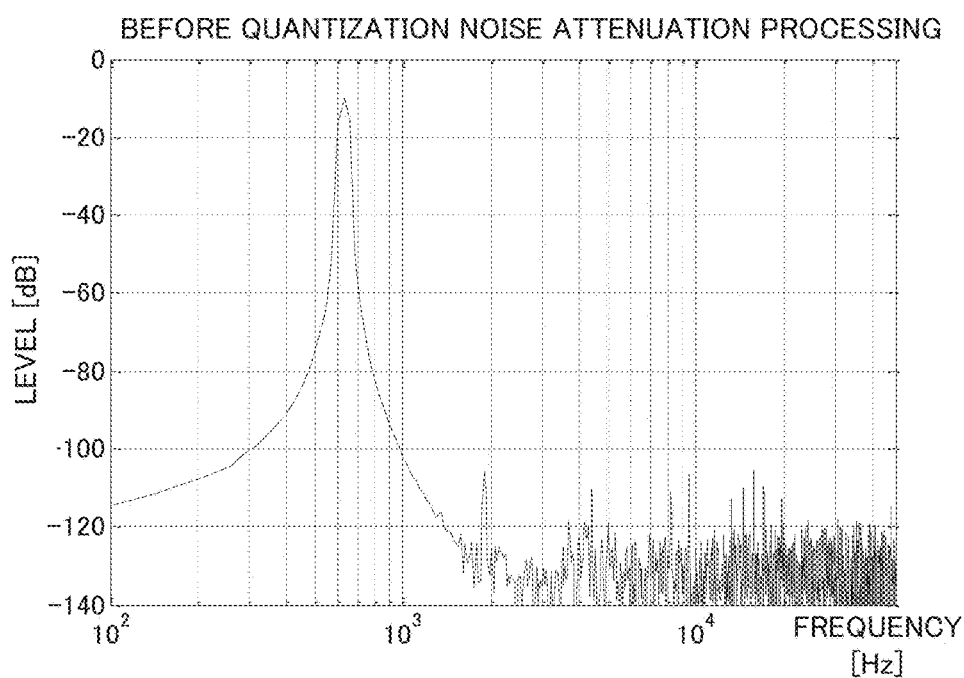
FIG. 6B is a frequency characteristic showing a calculation result of Fourier transform performed by applying a window function to the input signal with the frequency characteristic of 6A.
Figure 7A:
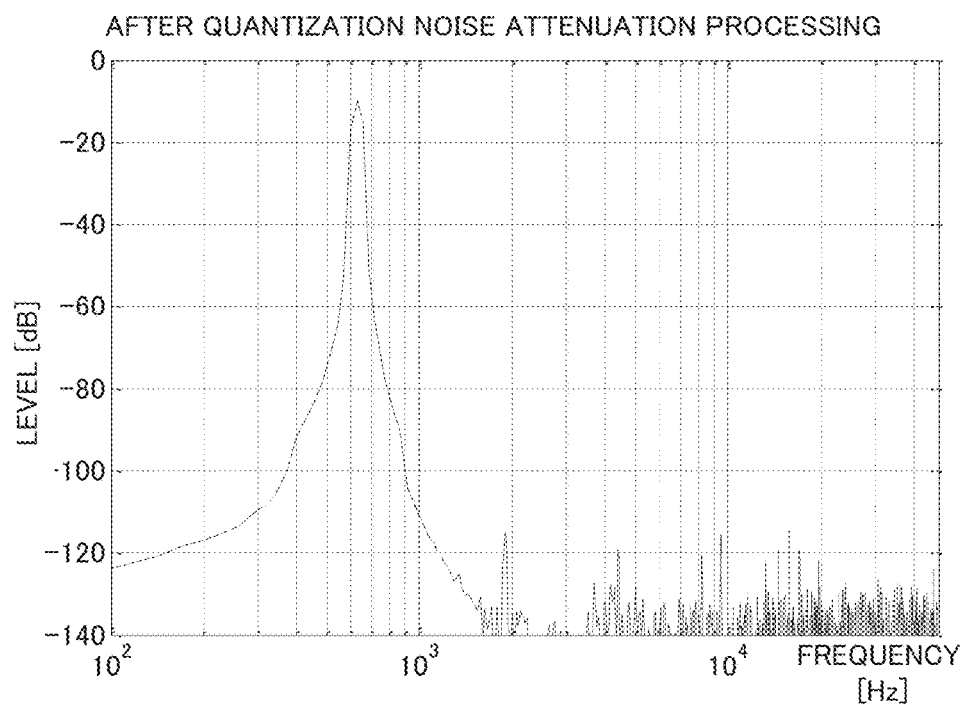
FIG. 7A shows a frequency characteristic obtained by performing quantization noise attenuation processing on the frequency characteristic of FIG. 6B.
Figure 7B:
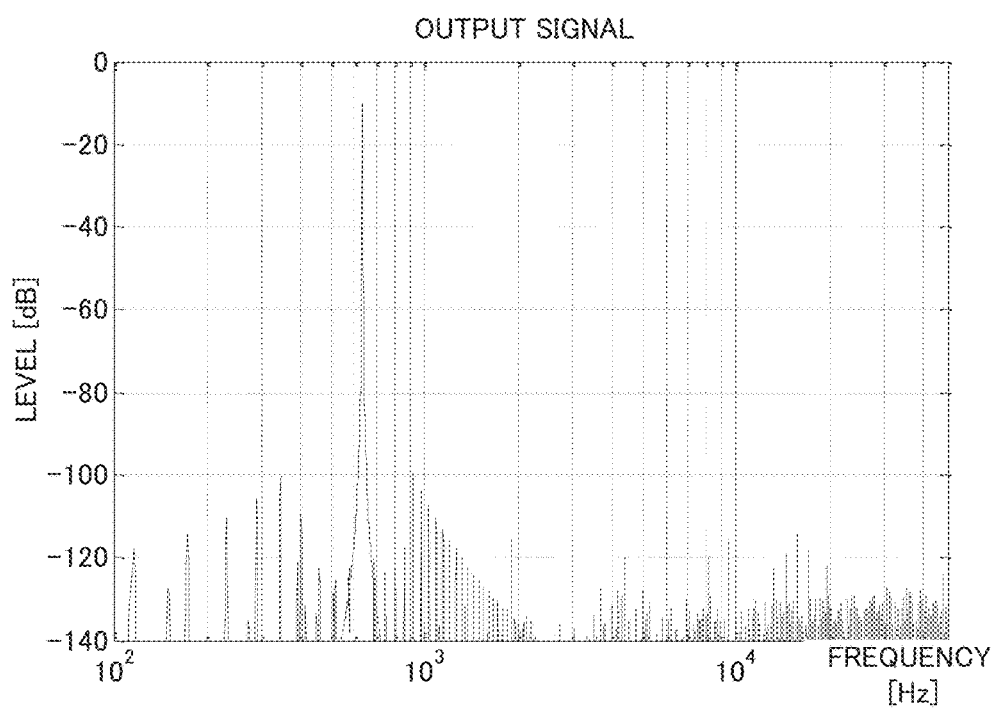
FIG. 7B shows the frequency characteristic of the output signal.

FIG. 6A shows the frequency characteristic of the input signal S1 with a relatively large input level, and FIG. 6B shows a characteristic after the Fourier transform has been performed by applying a window function to the input signal S1 that has the frequency characteristic shown in FIG. 6A (i.e., before the quantization noise attenuation processing). Further, FIG. 7A shows a characteristic after the quantization noise attenuation processing has been performed to uniformly attenuate the frequency less than −90.3 dB with respect to the characteristic of FIG. 6B, and FIG. 7B shows the frequency characteristic of the output signal S2, generated from the characteristic shown in FIG. 7A.

As shown in FIGS. 6A and 6B, when the input level of the input signal S1 is relatively large, by applying the window function, the range of the characteristic portion to be the peak spreads. Then, as shown in FIG. 7A, when the quantization noise attenuation processing is performed to uniformly attenuate the frequency less than −90.3 dB without depending on the input level of the input signal S1, the spread portion described above also attenuates with the quantization noise. The spread portion is originally required information to correctly turn the main signal contained in the input signal, except for the quantization noise, back to the output signal S2 in the IFFT block 26 and the time window resynthesis block 27. Hence, as shown in FIG. 7B, noise caused by the attenuation of the spread portion described above is generated in the output signal S2.

As thus described, in the case where the quantization noise attenuation processing is performed without providing the maximum attenuation amount when the input level of the input signal S1 is relatively large, there is a possibility that the originally required signal also attenuates due to the quantization noise attenuation processing, resulting in the degradation of the sound quality.

Figure 8A:
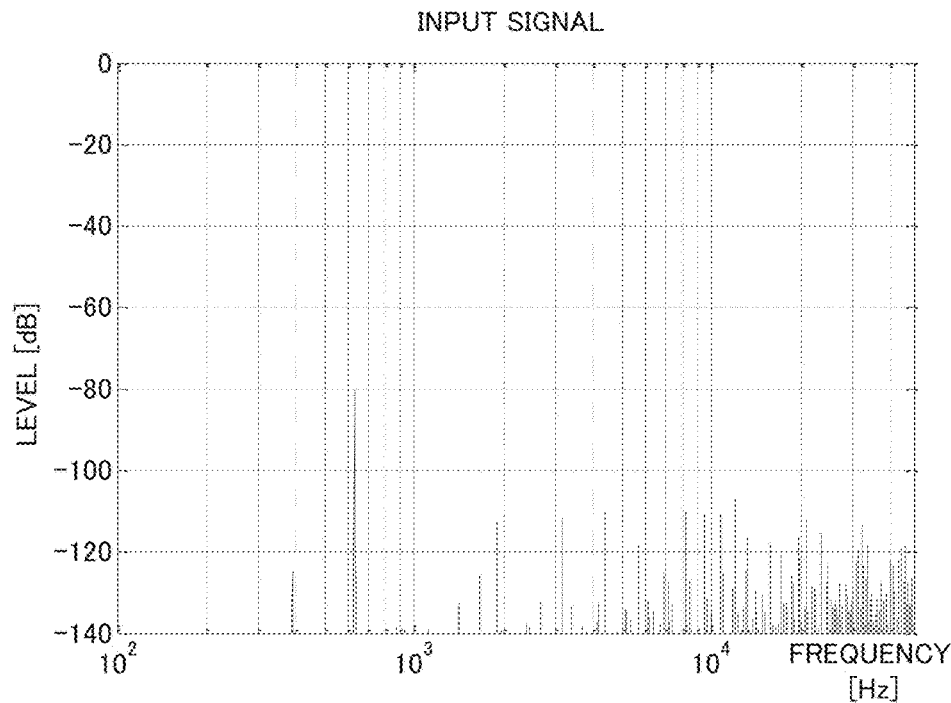
FIG. 8A is a frequency characteristic of an input signal with a relatively small input level.
Figure 8B:
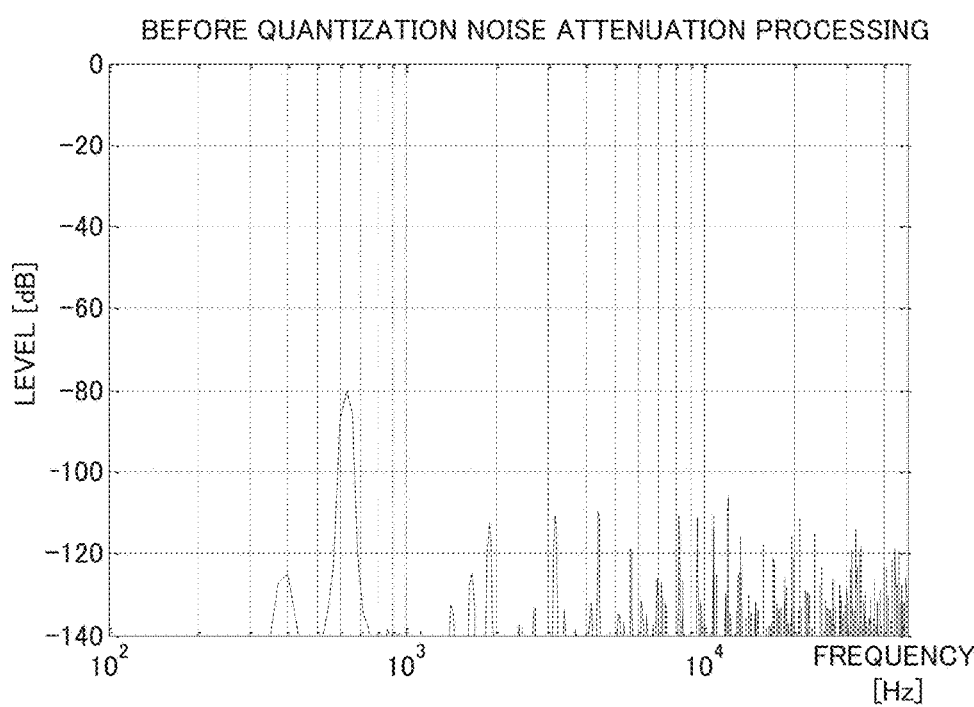
FIG. 8B is a frequency characteristic showing a calculation result of Fourier transform performed by applying a window function to the input signal with the frequency characteristic of 8A.
Figure 9A:
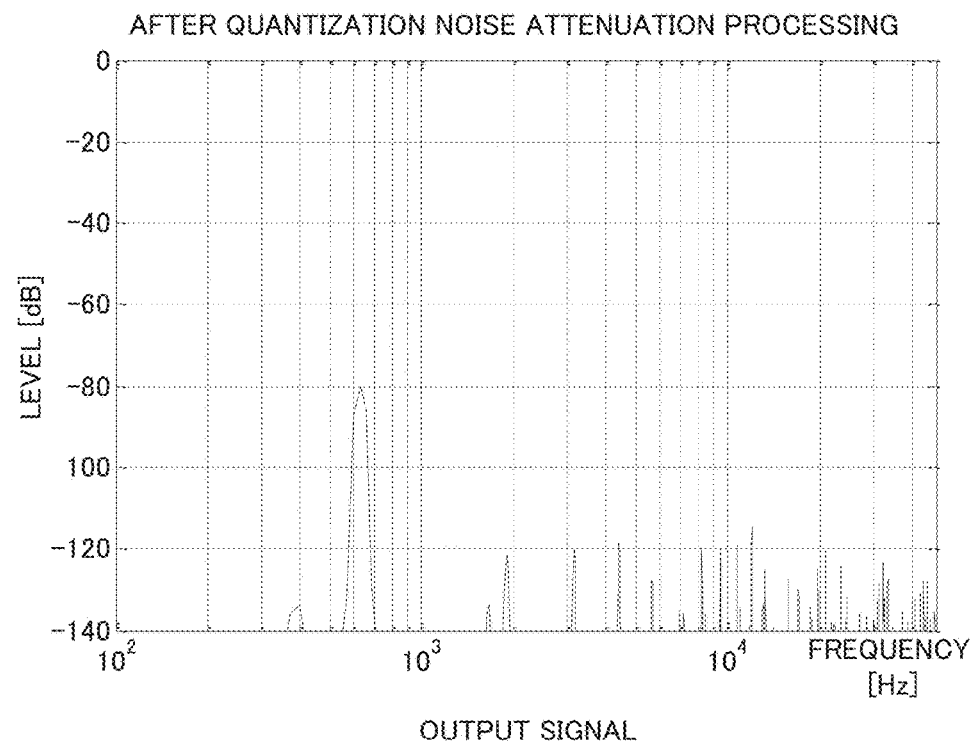
FIG. 9A shows a frequency characteristic obtained by performing the quantization noise attenuation processing on the frequency characteristic of FIG. 8B.
Figure 9B:
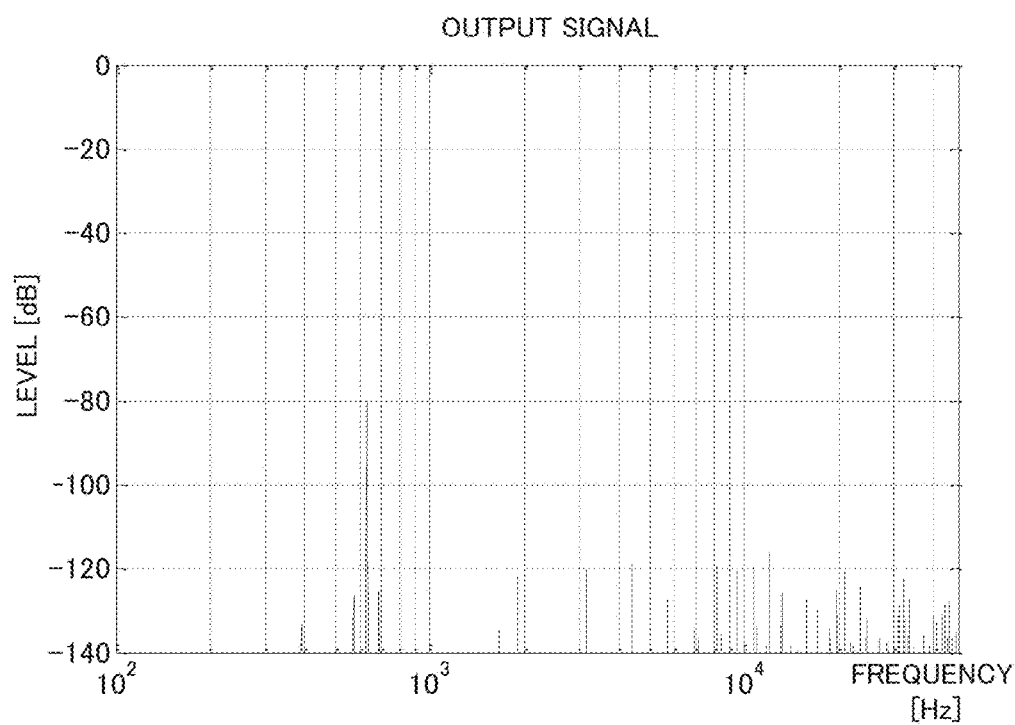
FIG. 9B shows the frequency characteristic of the output signal.

FIG. 8A shows the frequency characteristic of the input signal S1 with a relatively small input level, and FIG. 8B shows a characteristic after the Fourier transform has been performed by applying a window function to the input signal S1 that has the frequency characteristic shown in FIG. 8A (i.e., before the quantization noise attenuation processing). Further, FIG. 9A shows a characteristic after the quantization noise attenuation processing has been performed to uniformly attenuate the frequency less than −90.3 dB with respect to the characteristic of FIG. 8B, and FIG. 9B shows the frequency characteristic of the output signal S2, generated from the characteristic shown in FIG. 9A.

As shown in FIGS. 8A and 8B, when the input level of the input signal S1 is relatively small, even in a case where the Fourier transform is performed by applying a window function, the range of the characteristic portion to be the peak does not spread to the low-level region. Therefore, in this case, as shown in FIG. 9A, even when the quantization noise attenuation processing for attenuating the frequency less than −90.3 dB is performed, the attenuation range of the spread portion described above is small. Thus, in this case, as shown in FIG. 9B, noise caused by the quantization noise attenuation processing is hardly generated in the output signal S2.

As thus described, in the case where the quantization noise attenuation processing is performed when the input level of the input signal S1 is relatively small, it is possible to suitably attenuate the quantization noise without attenuating the originally required input signal. Further, as described with reference to FIG. 5, the smaller the input level of the input signal S1 is, the easier the quantization noise is to hear, and thus the higher the need to attenuate the quantization noise becomes. Considering the above, in the present embodiment, the smaller the input level of the input signal S1 is, the larger the maximum attenuation amount which the converter 2 sets becomes. Thereby, the converter 2 can effectively attenuate the quantization noise while suitably reducing the attenuation of the originally required input signal.

As described above, the time window cut-out block 21 of the converter 2 acquires the input signal S1 that is the quantized sound data, and cuts out sound data for each predetermined time interval. Then, the attenuation amount limitation block 23 determines the maximum attenuation amount based on the level of the sound data for each cut-out frame. Thereafter, on the basis of the maximum attenuation amount determined by the attenuation amount limitation block 23, the quantization noise attenuation block 24 determines the attenuation amount for the amplitude in the frequency domain of the input signal S1 (i.e. the control amount for the quantization noise). Thereby, the converter 2 can effectively attenuate the quantization noise in an audible range while suitably reducing the attenuation of the originally required input signal.

MODIFICATIONS

Next, modifications preferred for the present embodiment will be described. The following modifications may be applied to the above embodiment in any combination.

First Modification

In the above embodiment, as an example, the maximum attenuation amount calculation block 32 has determined the maximum attenuation amount with respect to each frame based on the RMS value corresponding to the average input level for each frame. As another example, the maximum attenuation amount calculation block 32 may determine the maximum attenuation amount for each frame by further considering the frequency for each frame in addition to the RMS value described above.

Figure 10:
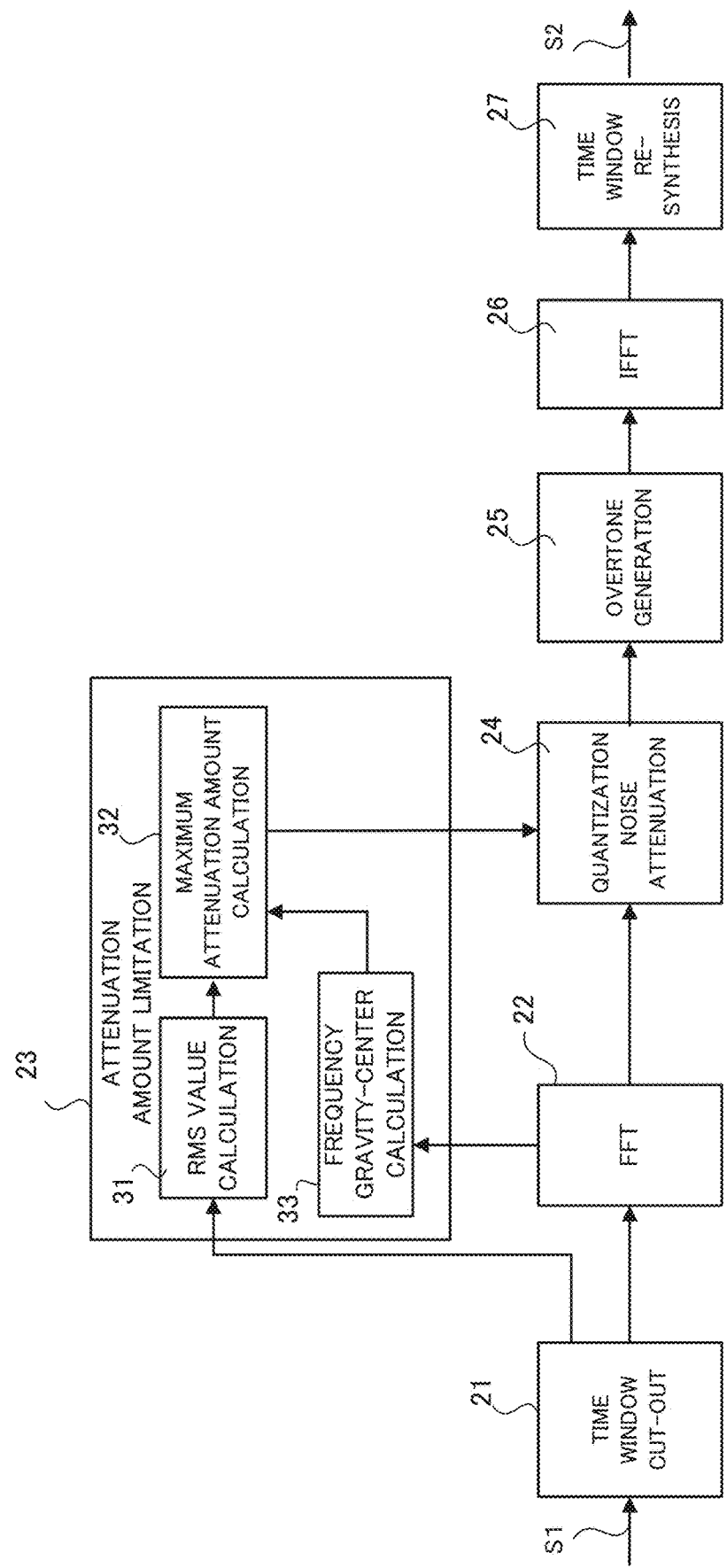
FIG. 10 shows a block configuration diagram of a converter according to a modification.

FIG. 10 shows the block configuration of the converter 2 according to the present modification. As shown in FIG. 10, the attenuation amount limitation block 23 of the converter 2 has a frequency gravity-center calculation block 33 in addition to the RMS value calculation block 31 and the maximum attenuation amount calculation block 32. Here, the frequency gravity-center calculation block 33 calculates the center of gravity of the frequency (i.e. spectral center of gravity) based on the frequency spectrum obtained by the FFT block 22 which performs the Fourier transform on the input signal S1 cut out for each frame by the time window cut-out block 21. Then, the frequency gravity-center calculation block 33 supplies the information on the calculated spectral center of gravity to the maximum attenuation amount calculation block 32.

The maximum attenuation amount calculation block 32 determines the maximum attenuation amount based on the RMS value obtained from the RMS value calculation block 31 and the spectral center of gravity obtained from the frequency gravity-center calculation block 33. In this case, for example, with reference to a table or a formula stored in the memory of the converter 2 in advance, the maximum attenuation amount calculation block 32 sets the maximum attenuation amount to be higher with the RMS value being lower, and the maximum attenuation amount calculation block 32 sets the maximum attenuation amount to be higher with the spectral center of gravity of the frequency being lower.

As described with reference to FIG. 5, there is a tendency that the lower the frequency of the input signal is, the easier the quantization noise is to hear. Therefore, according to the present modification, the lower the spectral center of gravity of the frequency is, the higher the maximum attenuation amount which the converter 2 sets becomes, so that the converter 2 can effectively attenuate the audible quantization noise and suitably improve the sound quality. In the above modification, the center of the spectrum has been calculated for each frame. Instead, the center of the spectrum may be calculated at intervals of a predetermined time length or, for example, the center of gravity corresponding to one song may be calculated as the center of the spectrum.

Second Modification

In the embodiment, the example of upconverting the input signal S1 of the CD standard to the output signal S2 of the high-resolution standard has been shown, but the example to which the present invention is applicable is not limited thereto.

For example, the converter 2 may convert the input signal S1 of the sound source such as MPEG-1 Audio Layer-3 (MP3) to the output signal S2 having a specification of the CD standard or the high-resolution standard level. In this case, after decoding the input signal S1, the converter 2 performs the processing of each processing block shown in FIG. 2 and the like, thereby performing the attenuation of quantization noise, the overtone generation, and the like. In this case, the quantization noise attenuation block 24 of the converter 2 estimates, as a component generated due to the quantization noise, a component with level less than the minimum level reproducible in the standard employed to the input signal S1 (−90.3 dB in the embodiment). Thus, the converter 2 attenuates the signal level at the frequency whose level is equal to or less than the above minimum level. As thus described, the present invention is suitably applied to various processing for up-conversion to a standard with a higher number of quantization bits.

Third Modification

In the embodiment, the example of the setting the level configured to determine the quantization noise to −90.3 dB has been shown, but the example to which the present invention is applicable is not limited thereto, and the level configured to determine the quantization noise may be adjusted in accordance with the conditions of the time window and frequency conversion.

Fourth Modification

In the embodiment, the example has been shown in the description of the attenuation amount limitation block 23 of FIG. 2 where the maximum attenuation amount with respect to the amplitude in the frequency domain, attenuated in the quantization noise attenuation block 24, is determined based on the magnitude of the signal levels in all the frequency bands of the sound data supplied from the time window cut-out block 21. However, the determination method for the maximum attenuation amount is not limited thereto.

For example, it is also possible that at the time of performing the quantization noise attenuation processing, the maximum attenuation amount calculation block 32 divides the sound data supplied from the time window cut-out block 21 into a band larger than a certain frequency and a band equal to or less than the frequency, and from the RMS value or the dB value converted from the RMS value in each band, the maximum attenuation amount calculation block 32 determines the maximum attenuation amount to be applied in each of the divided band.

Figure 11A:
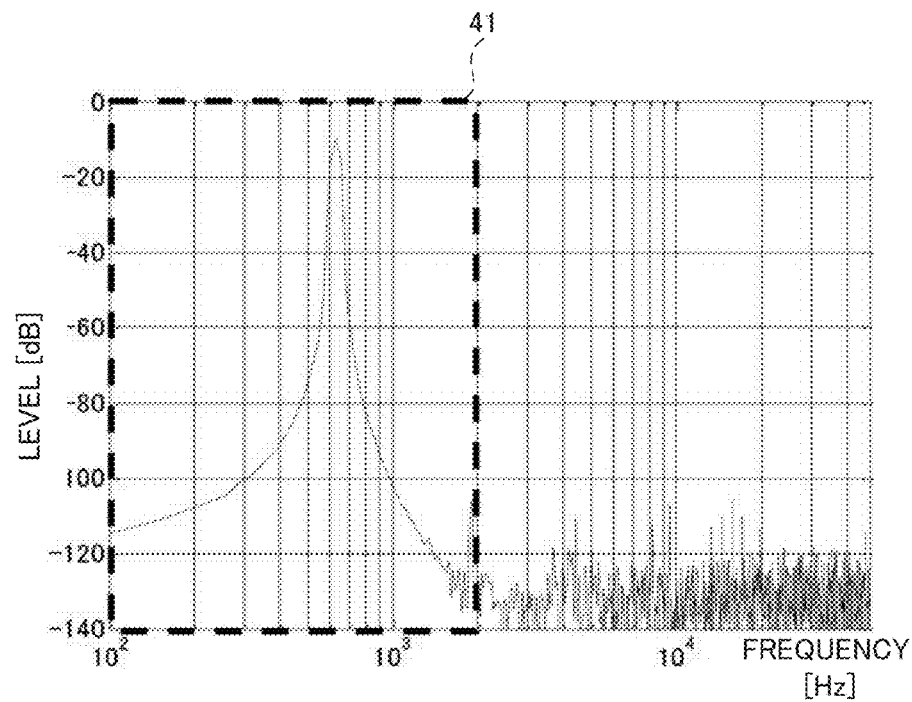
FIGS. 11A and 11B are diagrams each showing an example of division of frequency bands in a case where the maximum attenuation amount is determined with respect to each of a plurality of frequency bands.

Specifically, in a signal indicating a characteristic as shown in FIG. 11A, the frequency band is divided into a frequency band surrounded by a dashed line 41 and a frequency band not surrounded thereby. In the present example, the frequency band is divided into a band larger than 2000 Hz and a band of 2000 Hz or less. At this time, the RMS value in the band larger than 2000 Hz is smaller than the RMS value in the band of 2000 Hz or less. Therefore, the maximum attenuation amount in the band larger than 2000 Hz is larger than the maximum attenuation amount in the band of 2000 Hz or less.

Figure 11B:
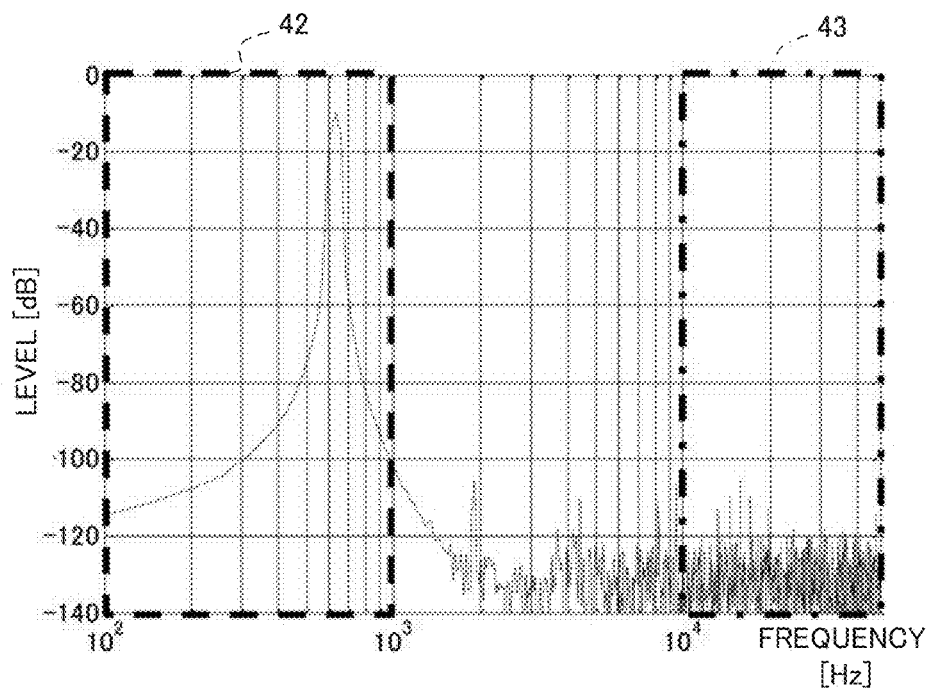

In the present embodiment, the frequency band has been divided into two relative to 2000 Hz, but the present invention is not limited thereto. As shown in FIG. 11B, the frequency band may be divided into three (a frequency band surrounded by a dashed line 42, a frequency band surrounded by a single-dot chain line 43, and the other frequency band) relative to 1000 Hz and 10000 Hz, or may be divided into three or more bands. As thus described, the value to be the reference for dividing the frequency band and the number of bands after the division can be changed as appropriate. In any case, the maximum attenuation amount calculation block 32 determines the maximum attenuation amount to be applied in each of the divided bands, from the RMS value or the dB value converted from the RMS value in each of the divided bands.

BRIEF DESCRIPTION OF REFERENCE NUMBERS

1 Input device
2 Converter
3 Output device
100 Sound output system

The invention claimed is:

1. A signal processing device comprising:
an acquisition unit configured to acquire sound data subjected to quantization; and
a quantization noise control unit configured to determine a control amount for quantization noise of the sound data, generated due to the quantization, based on the level of the sound data, wherein,
the control amount is an attenuation amount by which a signal level of the sound data is attenuated in a predetermined frequency band,
the quantization noise control unit changes the attenuation amount based on the sound level, and
the smaller the sound level is, the larger the quantization noise control unit makes the attenuation amount.

2. The signal processing device according to claim 1, wherein the quantization noise control unit determines the attenuation amount based on the level and a frequency of the sound data.

3. The signal processing device according to claim 2, wherein the lower the frequency, the larger the quantization noise control unit makes the attenuation amount.

4. The signal processing device according to claim 3, further comprising
a conversion unit configured to convert a time waveform of the sound data to a frequency domain,
wherein the quantization noise control unit attenuates an amplitude at the frequency whose amplitude in the frequency domain is less than a predetermined level, based on the control amount.

5. The signal processing device according to claim 3, further comprising
a division unit configured to divide the sound data into a plurality of frequency bands,
wherein the quantization noise control unit determines the control amount for the quantization noise with respect to each of the plurality of frequency bands.

6. The signal processing device according to claim 2, further comprising
a conversion unit configured to convert a time waveform of the sound data to a frequency domain,
wherein the quantization noise control unit attenuates an amplitude at the frequency whose amplitude in the frequency domain is less than a predetermined level, based on the control amount.

7. The signal processing device according to claim 2, further comprising
a division unit configured to divide the sound data into a plurality of frequency bands,
wherein the quantization noise control unit determines the control amount for the quantization noise with respect to each of the plurality of frequency bands.

8. The signal processing device according to claim 1, further comprising
a conversion unit configured to convert a time waveform of the sound data to a frequency domain,
wherein the quantization noise control unit attenuates an amplitude at the frequency whose amplitude in the frequency domain is less than a predetermined level, based on the control amount.

9. The signal processing device according to claim 8, wherein the conversion unit converts the time waveform of the sound data, cut out with a predetermined time interval, to a frequency domain.

10. The signal processing device according to claim 9, further comprising
a division unit configured to divide the sound data into a plurality of frequency bands,
wherein the quantization noise control unit determines the control amount for the quantization noise with respect to each of the plurality of frequency bands.

11. The signal processing device according to claim 8, further comprising
a division unit configured to divide the sound data into a plurality of frequency bands,
wherein the quantization noise control unit determines the control amount for the quantization noise with respect to each of the plurality of frequency bands.

12. The signal processing device according to claim 1, further comprising
a division unit configured to divide the sound data into a plurality of frequency bands,
wherein the quantization noise control unit determines the control amount for the quantization noise with respect to each of the plurality of frequency bands.

13. A control method to be performed by a signal processing device, the method comprising:
acquiring sound data subjected to quantization; and
determining a control amount for quantization noise of the sound data, generated due to the quantization, based on the level of the sound data, wherein,
the control amount is an attenuation amount by which a signal level of the sound data is attenuated in a predetermined frequency band,
the attenuation amount changes based on the sound level, and
the smaller the sound level is, the larger the attenuation amount.

14. A non-transitory computer readable medium including instructions to be executed by a computer, the instructions comprising:
acquiring sound data subjected to quantization, and
determining a control amount for quantization noise of the sound data, generated due to the quantization, based on the level of the sound data, wherein,
the control amount is an attenuation amount by which a signal level of the sound data is attenuated in a predetermined frequency band,
the attenuation amount changes based on the sound level, and
the smaller the sound level is, the larger the attenuation amount.

* * * * *